(12) United States Patent
Tsuchida et al.

(10) Patent No.: US 10,375,280 B2
(45) Date of Patent: Aug. 6, 2019

(54) IMAGING DEVICE WITH IMPROVED HEAT DISSIPATION INCLUDING A BOARD SECTION BETWEEN A FIRST AND A SECOND HOUSING

(71) Applicant: FUJI CORPORATION, Chiryu (JP)

(72) Inventors: Kosuke Tsuchida, Oguchi-cho (JP); Takeshi Nomura, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/326,743

(22) PCT Filed: Jul. 18, 2014

(86) PCT No.: PCT/JP2014/069204
§ 371 (c)(1),
(2) Date: Jan. 17, 2017

(87) PCT Pub. No.: WO2016/009558
PCT Pub. Date: Jan. 21, 2016

(65) Prior Publication Data
US 2017/0208227 A1     Jul. 20, 2017

(51) Int. Cl.
*H04N 5/225* (2006.01)
*H05K 7/20* (2006.01)
(Continued)

(52) U.S. Cl.
CPC ............. *H04N 5/2252* (2013.01); *G02B 7/02* (2013.01); *G03B 17/02* (2013.01); *G03B 17/55* (2013.01);
(Continued)

(58) Field of Classification Search
CPC .... H05K 1/0201; H05K 1/0209; H05K 1/021; H05K 7/205; H05K 7/20509;
(Continued)

(56) References Cited

U.S. PATENT DOCUMENTS 4,896,217 A * 1/1990 Miyazawa ........ H01L 27/14618
348/294
5,221,964 A * 6/1993 Chamberlain ....... H04N 5/2251
348/224.1
(Continued)

FOREIGN PATENT DOCUMENTS

JP     63-107378 A     5/1988
JP     4-111580 A     4/1992
(Continued)

OTHER PUBLICATIONS

International Search Report dated Oct. 21, 2014 in PCT/JP2014/069204 filed Jul. 18, 2014.

*Primary Examiner* — Twyler L Haskins
*Assistant Examiner* — Akshay Trehan
(74) *Attorney, Agent, or Firm* — Oblon, McClelland, Maier & Neustadt, L.L.P.

(57) ABSTRACT

An imaging device including a board section on which imaging element is loaded, a first housing section for fixing board section from a surface on which imaging element is loaded; a second housing section for fixing board section from a surface opposite to the surface on which imaging element is loaded; and a lens section attached to the first housing section side; and the first housing section and the second housing section are fixed by attachment members so as to sandwich board section. The first housing section may be configured from board fixing member for fixing board section, and the lens attachment member for attaching lens section that is fixed to board fixing member in a positionally adjustable manner.

6 Claims, 8 Drawing Sheets

(51) Int. Cl.
*H05K 1/02* (2006.01)
*G02B 7/02* (2006.01)
*G03B 17/55* (2006.01)
*G03B 17/02* (2006.01)
*B23P 15/26* (2006.01)

(52) U.S. Cl.
CPC ............ *H04N 5/225* (2013.01); *H04N 5/2253* (2013.01); *H04N 5/2254* (2013.01); *H04N 5/22521* (2018.08); *H05K 1/0201* (2013.01); *H05K 7/2039* (2013.01); *B23P 15/26* (2013.01); *B23P 2700/10* (2013.01)

(58) Field of Classification Search
CPC .. H05K 7/2039; H05K 1/0207; H05K 1/0204; B23P 15/26; B23P 2700/10; H04N 5/2253; H04N 5/2252; H04N 5/2254; H04N 5/2251; H04N 5/22521
See application file for complete search history.

(56) References Cited

U.S. PATENT DOCUMENTS

| | | | | |
|---|---|---|---|---|
| 6,078,359 | A * | 6/2000 | Conder | H04N 5/2251 257/718 |
| 7,329,869 | B2 * | 2/2008 | Cassel | H04N 5/2252 250/339.03 |
| 7,362,372 | B2 * | 4/2008 | Lyon | G08B 13/19619 348/151 |
| 8,115,856 | B2 * | 2/2012 | Cheng | H02K 11/01 348/357 |
| 8,970,781 | B2 * | 3/2015 | Ryou | G02B 7/08 348/208.7 |
| 9,179,052 | B2 * | 11/2015 | Lee | H04N 5/2257 |
| 9,270,873 | B2 * | 2/2016 | Han | H04N 5/2257 |
| 9,386,202 | B2 * | 7/2016 | Son | H04N 5/2257 |
| 9,432,561 | B2 * | 8/2016 | Samuels | G03B 17/568 |
| 2009/0086417 | A1 * | 4/2009 | Hasegawa | G03B 17/02 361/679.01 |
| 2010/0158508 | A1 * | 6/2010 | Kim | H04N 5/2253 396/529 |
| 2010/0165132 | A1 * | 7/2010 | Tokiwa | G02B 27/646 348/208.11 |
| 2011/0037893 | A1 | 2/2011 | Okada | |
| 2011/0096456 | A1 * | 4/2011 | Kim | H04N 5/2252 361/220 |
| 2012/0026337 | A1 * | 2/2012 | Boulanger | G01J 5/046 348/164 |
| 2013/0076975 | A1 * | 3/2013 | Kumoi | H04N 5/2254 348/373 |
| 2013/0093948 | A1 * | 4/2013 | Takeshita | H04N 5/2253 348/374 |
| 2013/0292477 | A1 * | 11/2013 | Hennick | G06K 7/10732 235/469 |
| 2014/0055671 | A1 * | 2/2014 | Kawamura | H04N 5/2252 348/374 |
| 2014/0104479 | A1 * | 4/2014 | Samuels | G03B 17/55 348/335 |
| 2014/0320657 | A1 * | 10/2014 | Han | B60R 11/04 348/148 |
| 2014/0362286 | A1 * | 12/2014 | Komi | G06K 7/10732 348/374 |
| 2015/0181698 | A1 * | 6/2015 | Suganuma | H04N 5/2253 250/208.1 |

FOREIGN PATENT DOCUMENTS

| | | |
|---|---|---|
| JP | 5-2482 U | 1/1993 |
| JP | 2010-74626 A | 4/2010 |
| JP | 2010-199647 A | 9/2010 |
| JP | 2012-137789 A | 7/2012 |
| WO | 2009/131017 A1 | 10/2009 |

* cited by examiner

IMAGING DEVICE WITH IMPROVED HEAT DISSIPATION INCLUDING A BOARD SECTION BETWEEN A FIRST AND A SECOND HOUSING

TECHNICAL FIELD

The present application relates to an imaging device with a board section on which an imaging element is loaded.

BACKGROUND ART

As an imaging device such as an industrial-use camera, that disclosed in PTL 1 and the like is known, but for recent imaging devices, there is a need for imaging devices to be compact as well as having high performance. However, many conventional imaging devices are configured such that a board on which an imaging element is loaded is fixed inside a housing of the imaging device.

CITATION LIST

Patent Literature

PTL 1: JP-A-2012-137789

SUMMARY

Thus, conventionally, the outer dimensions of an imaging device are larger than the outer dimensions (surface area) of the board, thereby restricting how small the device can be made. Also, with this type of imaging device, the higher the performance, the larger the energy consumption, leading to a tendency for a large amount of heat to be generated inside the imaging device, meaning that, if trying to satisfy the demand for a small device, it is difficult to apply forced cooling such as that using a heat dissipation fan or the like. For this, it is effective to perform heat dissipation using heat conduction via a heat transfer plate or the like, but accommodating heat dissipation configuration items such as a heat transfer plate inside the imaging device prevents the device from being made smaller; on the other hand, if priority is given to making the device small, the heat dissipation performance suffers, and the characteristics of the imaging element worsen.

The present disclosure takes account of such problems and an object thereof is to provide an imaging device which can be made small while having improved heat dissipation performance.

To solve the above problems, the present disclosure is an imaging device including: a board section on which an imaging element is loaded; a first housing section for fixing the board section from a surface on which the imaging element is loaded; a second housing section for fixing the board section from a surface opposite to the surface on which the imaging element is loaded; and a lens section attached to the first housing section side, wherein the first housing section and the second housing section are fixed by an attachment member so as to sandwich the board section.

Effects

According to the present disclosure, because the board section is fixed by being sandwiched by the first housing section and the second housing section that are fixed by the attachment member, the outer dimensions of the imaging device can be restricted to about the same size as the outer dimensions of the board section, allowing the imaging device to be made small.

DESCRIPTION OF EMBODIMENTS

Figure 1:
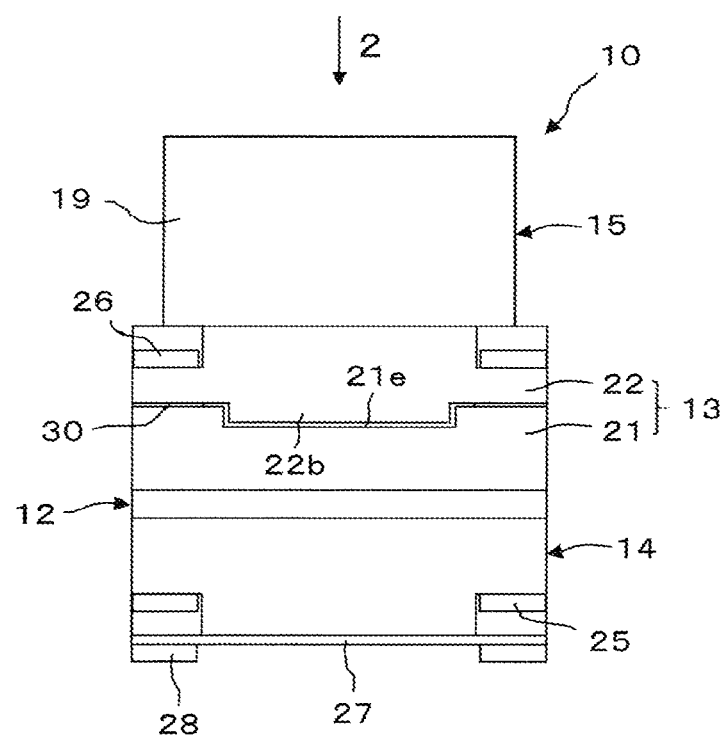
FIG. 1 is an exterior view of an imaging device that is an embodiment of the present disclosure.
Figure 2:
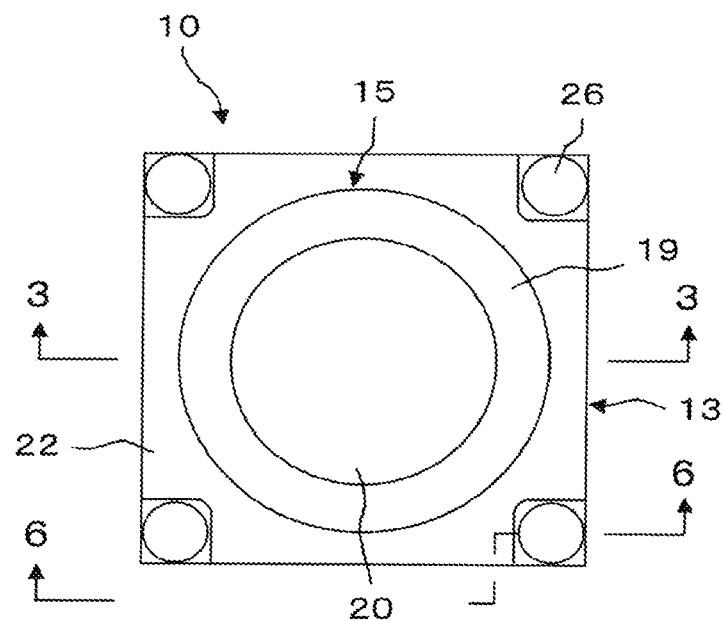
FIG. 2 is a view from the direction of arrow 2 in FIG. 1.

An embodiment of the present disclosure is described below with reference to the figures. As shown in FIGS. 1 to 4, imaging device 10 is configured mainly from board section 12 with control board 18 on which imaging element 17 is loaded, first housing section 13 for fixing board section 12 from the surface on which imaging element 17 is loaded, second housing section 14 for fixing board section 12 from a surface opposite to the surface on which imaging element 17 is loaded, and lens section 15 attached to the first housing side. First housing section 13 and second housing section 14 configure an outside wall of imaging device 10.

Figure 3:
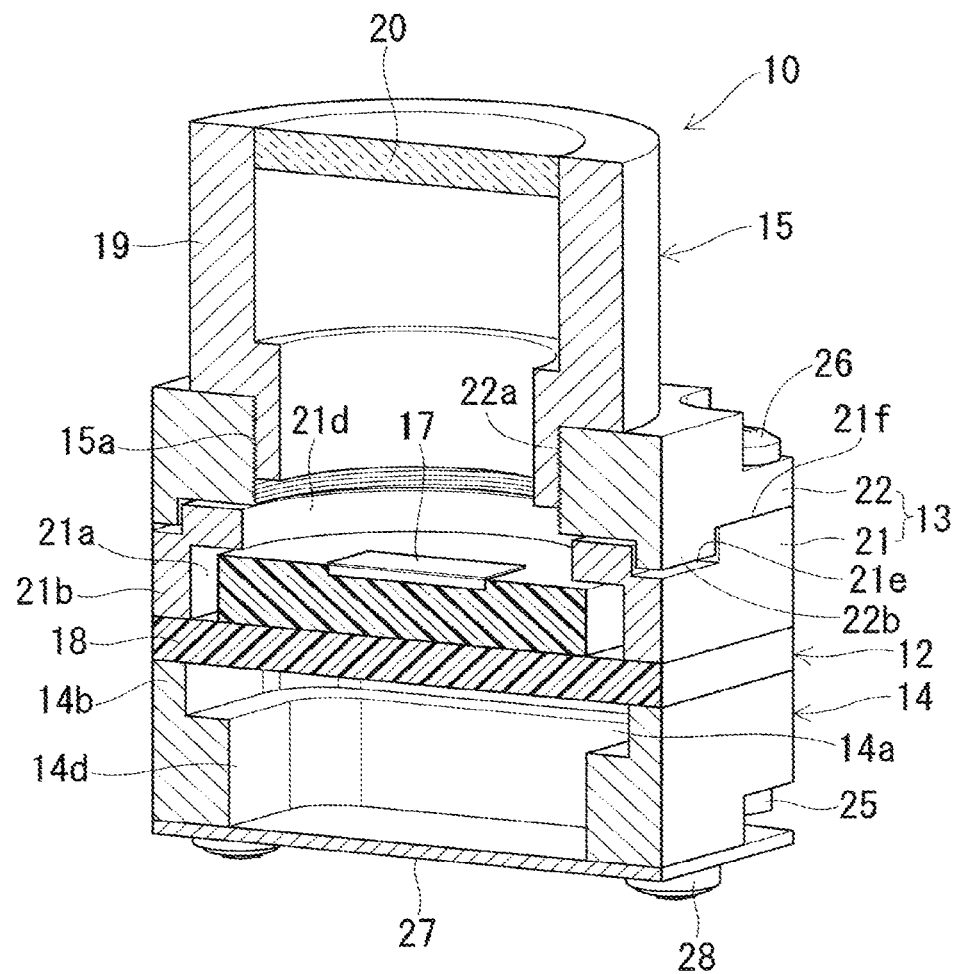
FIG. 3 is a perspective view of the imaging device cut through along line 3-3 of FIG. 2.

Note that, for ease of understanding, in the descriptions below, the vertical direction in FIG. 3 that is parallel to the optical axis of lens section 15 is referred to as the Z direction, the left-right direction in FIG. 3 that is perpendicular to the Z direction is referred to as the X direction, and the front-rear direction in FIG. 3 that is perpendicular to the Z direction and X direction is referred to as the Y direction.

Lens section 15 is for forming an image of light of a target object on imaging element 17 on control board 18. Imaging element 17 is formed from an image sensor such as a CCD, CMOS, or the like, and is arranged such that the imaging surface of imaging element 17 is at right angles to the optical axis of lens section 15.

In the present embodiment, first housing section 13 is configured from board fixing member 21 for fixing board section 12, and lens attachment member 22 for attaching lens section 15, and as described below, lens attachment member 22 is fixed to board fixing member 21 in a positionally adjustable manner.

Figure 5:
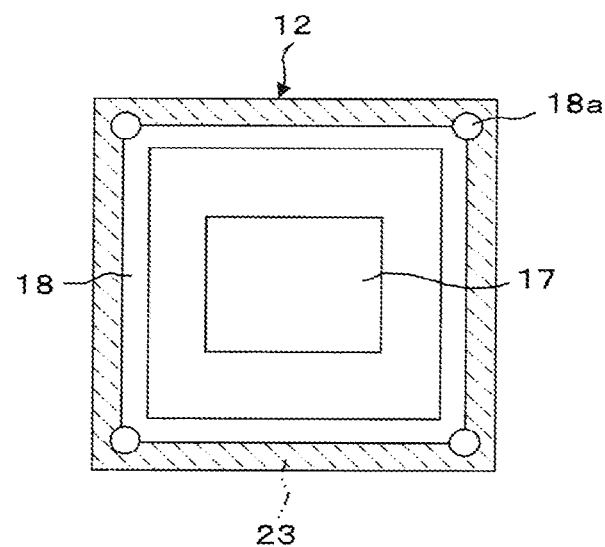
FIG. 5 is a plan view of the board section.

Control board 18 of board section 12 is, for example, formed from a glass-epoxy board with a rectangular plate shape. Imaging element 17 is loaded on a central section of control board 18. As shown in FIG. 5, conductor body pattern 23 is formed on both edge section surfaces of control board 18, and conductor body pattern 23 is connected to ground potential of control board 18. Through-holes 18*a* in which attachment members, to be described later, are to be inserted are formed in the corners of control board 18. Note that, conductor body pattern 23 is formed by resist (protective layer) that covers the upper surface of control board 18 being peeled off the edge section of control board 18 to reveal copper wiring.

Figure 6:
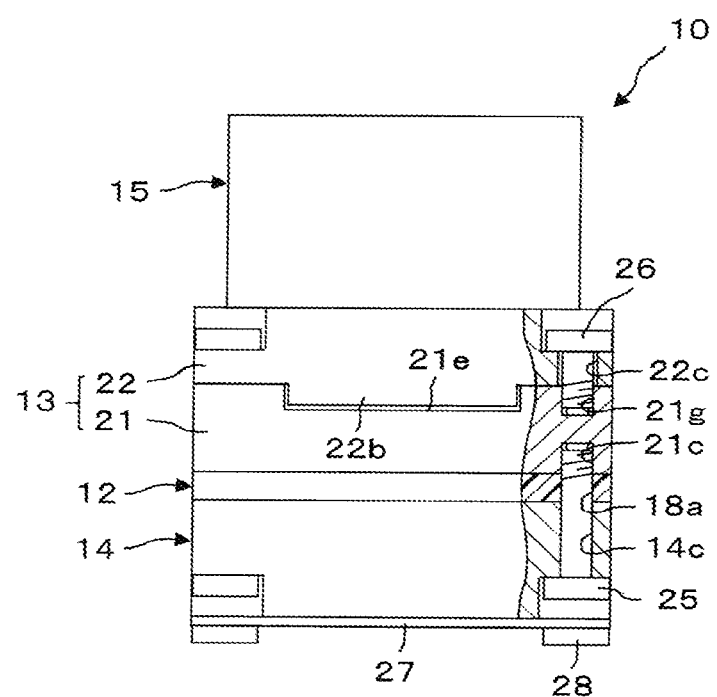
FIG. 6 is a cutaway view along line 6-6 of FIG. 2.

Board fixing member 21 is rectangular with the same size as control board 18 of board section 12, and is formed from a metal with excellent heat dissipation properties such as aluminum. Cavity section 21a formed at a specified depth by a rectangular section being dug out is formed in the surface of board fixing member 21 facing board section 12, that is, the lower surface of FIGS. 3 and 4 (hereinafter also referred to as the reverse surface); a protruding section that protrudes above control board 18 is accommodated in cavity section 21a. Contact section 21b is provided around the outside of the circumference of cavity section 21a of board fixing member 2 along a rectangular shape that contacts conductor body pattern 23 of control board 18. Also, as shown in FIG. 6, first screw holes (tap holes) 21c are formed in the four corners of the reverse side of board fixing member 21 in a direction parallel to the optical axis of lens section 15, and with the same center position as through-holes 18a formed in the four corners of control board 18.

Figure 4:
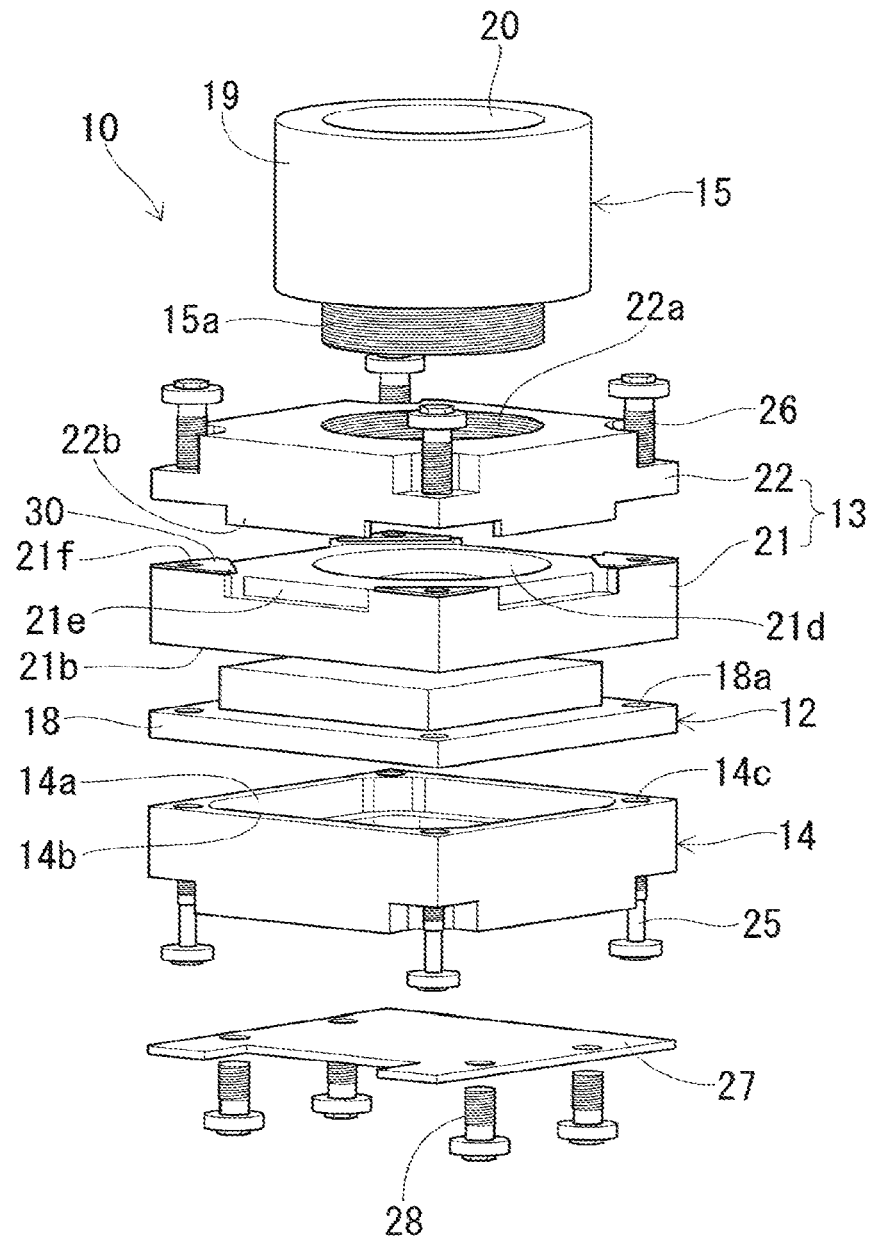
FIG. 4 is an exploded view of the imaging device.

Circular or rectangular center hole 21d is formed in a central portion of the surface of board fixing member 21 opposite to the surface facing board section 12, that is, the upper surface in FIGS. 3 and 4 (hereinafter also referred to as the top surface). Also, belt-shaped recesses 21e are formed at a central portion of each of the four edges of the edge section of the top surface of board fixing member 21. By belt-shaped recesses 21e being formed along the four edges, seating surfaces 21f on which shim 30, which is described below, is loaded are formed at the four corners of the top surface of board fixing member 21.

Second housing section 14 is rectangular with the same size as control board 18 of board section 12, and is formed from a metal with excellent heat dissipation properties such as aluminum. Cavity section 14a formed at a specified depth by a rectangular section being dug out is formed in the surface of second housing section 14 facing board section 12, (the upper surface in FIGS. 3 and 4); contact section 14b protrudes around the circumference of cavity section 14a along a rectangular shape that contacts conductor body pattern 23 of control board 18. Also, through-holes 14c are formed in the four corners of second housing section 14 in a direction parallel to the optical axis, and with the same center position as through-holes 18a formed in the four corners of control board 18.

Note that, cavity sections 21a and 14a of a specified depth are formed in board fixing member 21 and second housing section 14 such that rectangular contact sections 21b and 14b are formed at the contact positions of board fixing member 21 and second housing section 14 with control board 18, and such that the attachment position of imaging element 17 can be changed in the Z direction according to changes in the focal length of imaging device 10.

Four first attachment members (screws) 25 are inserted from the reverse side (the lower side in FIGS. 3 and 4) of second housing section 14 into through-holes 14c in the four corners of second housing section, and first attachment members 25 are inserted into through-holes 18a in the four corners of control board 18 and screwed into first screw holes 21c in the four corners of board fixing member 21. By this, control board 18 is sandwiched between board fixing member 21 and second housing section 14, and is fixed to board fixing member 21 and second housing section 14.

Here, by forming each through-hole 14c and 18a of second housing section 14 and board section 12 with dimension tolerances to fit tightly with the axis section of first attachment members 25, board fixing member 21, board section 12, and second housing section 14 can be fixed while being positioned in relation to each other in an XY plane. Also, board section 12 (control board 18) is fixed such that contact sections 21b of board fixing member 21 and contact sections 14b of second housing section 14 are in a state in full surface contact with conductor body pattern 23 of control board 18, therefore heat generated from imaging element 17 due to use of imaging device 10 is transmitted to board fixing member 21 and second housing section 14 that have excellent heat dissipation properties, and thus dissipated outside by board fixing member 21 and second housing section 14.

Lens attachment member 22 is rectangular with the same size as board fixing member 21, and is fixed to the top surface of board fixing member 21 in a positionally adjustable manner. Screw hole 22a for attaching lens section 15 is formed in a central portion of lens attachment member 22, and screw section 15a formed on lens section 15 screws into screw hole 22a such that lens section 15 is fixed as one to lens attachment member 22.

Belt-shaped protrusion 22b is formed at a central portion on each edge on the lower surface of lens attachment member 22 on the side opposite to the side to which lens section 15 is attached. Belt-shaped protrusions 22b fit inside belt-shaped recesses 21e formed in the top surface of board fixing member 21 with a small amount of play. By this, the position of lens attachment section 22 with respect to board fixing member 21 is allowed to be adjusted a small amount while preventing foreign objects from getting between board fixing member 21 and lens attachment member 22.

Also, through-holes 22c are formed in the four corners of lens attachment member 22 in a direction parallel to the optical axis. Four second attachment members (screws) 26 are inserted into the four corner through-holes 22c from the upper surface side of lens attachment member 22 with some play, and second attachment members 26 are inserted into second screw holes (tap holes) 21g (refer to FIG. 6), which are in the four corners of the top surface of board fixing member 21.

Here, shims 30 are inserted between lens attachment member 22 and each of the seating surfaces 21f formed at the four corners of the top surface of board fixing member 21, and by adjusting the thickness of these shims 30, it is possible to adjust the pitch of the optical axis of lens section 15 with respect to imaging element 17. Also, the rotational deviation of lens section 15 is adjusted with respect to imaging element 17 and the optical axis of lens section 15 by positional adjustment around the Z axis and positional adjustment in the XY horizontal plane of lens attachment member 22 with respect to board fixing member 21. After positional adjustment of lens attachment member 22 with respect to board fixing member 21, lens attachment member 22 is fixed as one to board fixing member 21 by second attachment members 26, thus configuring first housing body 13.

Note that, the lower surface four corners of second housing section 14 that engages with the head section of first attachment member 25, and the upper surface four corners of lens attachment member 22 that engages with the head section of second attachment member 26 are each countersunk, such that the head section of first attachment member 25 and the head section of second attachment member 26 do not protrude from the lower surface of second housing section 14 or the upper surface of lens attachment member 22.

Circular or rectangular center hole 14d is formed in a central portion of the surface of second housing 14 opposite to the surface facing board section 12 (hereinafter also referred to as the reverse surface). Cover plate 27 is fixed to the reverse surface of second housing section 14 by third attachment members 28, so as to plug center hole 14d of second housing section 14. Note that, although not shown in the figures, a gap is formed between second housing section 14 and cover plate 27 such that cables coming out of board section 12 are able to pass through.

Next, the assembly of imaging device 10 of the embodiment is described with reference to FIG. 4. First, board section 12 with control board 18 on which imaging element is loaded is arranged between board fixing member 21 of first housing section 13 and second housing section 14, and each through-hole 18a and 14c of control board 18 and second housing section 14 are lined up with first screw holes 21c in the four corners of board fixing member 21.

In that state, first attachment members 25 are inserted into through-holes 14c in the four corners of second housing section 14 from the reverse surface (the lower surface in FIG. 4) of second housing section 14, and are each inserted into a respective first screw hole 21c of board fixing member 21 after passing through a respective through-hole 18a of control board 18. By this, conductor body pattern 23 (refer to FIG. 5) formed at the edge section of control board 18 is sandwiched by contact sections 21b and 14b of board fixing member 21 and second housing section 14, such that board section 12 is fixed to board fixing member 21 and second housing section 14.

Continuing, a shim 30 is placed on each seating surface 21f at the four corners of board fixing member 21, lens attachment member 22 with lens section 15 attached is arranged on the shims 30, and through-holes 22c of lens attachment member 22 are aligned with second screw holes 21g in the four corners of board fixing member 21. In that state, second attachment members 26 are inserted into through-holes 22c at the four corners of lens attachment member 22 from the upper surface side of lens attachment member 22, and are each inserted into a respective second screw hole 21g of board fixing member 21. By this, as shown in FIG. 1, lens attached member 22 with lens section 15 attached is attached to board fixing member 21 via shims 30.

Next, in order to adjust the pitch of the imaging surface and the optical axis of lens section 15, lens attachment member 22 is positionally adjusted with respect to board fixing member 21. Adjustment of the pitch of the imaging surface is performed by exchanging at least one of the shims 30 placed on seating surfaces 21f in the four corners of board fixing member 21 for a shim of a different thickness. Also, adjustment of the optical axis of lens section 15, and adjustment of the rotational deviation of lens section 15 with respect to imaging element 17 is performed by positionally adjusting lens attachment member 22 with respect to board fixing member 21 in the horizontal plane and rotationally around the Z axis. Then, second attachment members 26 are tightened so as to fix lens attachment member 22 to board fixing member 21.

According to the above embodiment, board section 12 on which imaging element 17 is loaded is fixed by being sandwiched by board fixing member 21 and second housing section 14, therefore it is possible to restrict the outer dimensions of imaging device 10 to about the same size as the outer dimensions of board section 12, allowing imaging device 10 to be made small.

Also, according to the above embodiment, board section 12 is fixed in a state with contact sections 21b and 14b formed in board fixing member 21 and second housing section 14 contacting conductor body pattern 23 formed at the edge section of board section 12, therefore heat generated by imaging element 17 is dissipated via board fixing member 21 and second housing section 14 that are connected to conductor body pattern 23. In particular, the heat dissipation properties are improved by the basic configuration of imaging device 10 and it is not necessary to add a special member for heat dissipation.

Note that, with the above embodiment, an example is given in which first housing section 13 is configured from board fixing member 21 and lens attachment member 22 that is positionally adjustable with respect to board fixing member 21; however, positionally adjustability is not essential for the present disclosure, first housing body section 13 may be configured such that board fixing member 21 and lens attachment member 22 are one indivisible body.

Also, in the above embodiment, contact sections 21b and 14b of first housing section 13 (board fixing member 21) and second housing section 14 that sandwich board section 12 each contact conductor body pattern 23 formed at the edge section of board section 12; however, even if conductor body pattern 23 is only formed at the edge section of one surface of control board 18 and only one of first housing section 13 (board fixing member 21) and second housing section 14 contact conductor body pattern 23, this is still effective for dissipating heat of board section 12.

Figure 7:
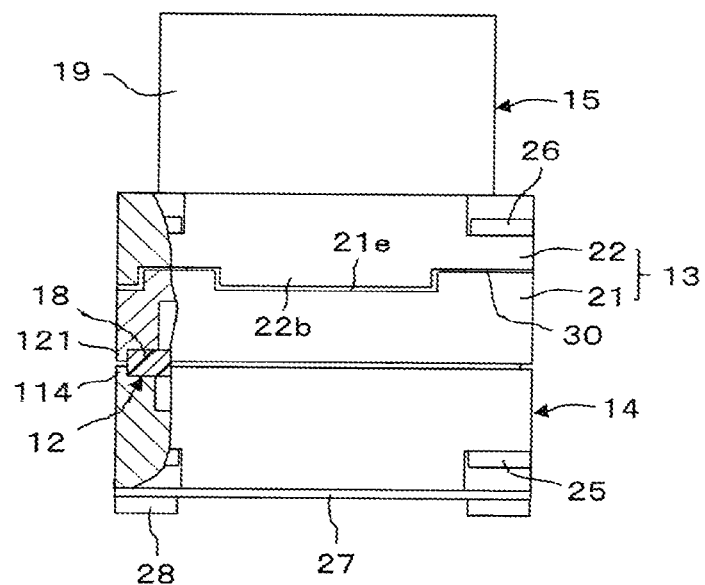
FIG. 7 is an alternative embodiment of the present disclosure.

FIG. 7 is an alternative embodiment of the present disclosure, with the outer surface of board section 12 covered by first housing section 13 (board fixing member 21) and second housing section 14. Note that, for the constituent components which are the same as those mentioned for the first embodiment, the same reference symbols are used and descriptions are omitted.

In the alternative embodiment shown in FIG. 7, for example, thin covering section 121 protrudes down from the edge section of board fixing member 21, and this thin covering section 121 contacts the outer surface of control board 18 of board section 12. Also, for example, thin covering section 114 protrudes upwards towards the edge section of second housing section 14 and such that covering section 114 contacts the outer surface of circuit board 18.

As a result, the outer surface of board section 12 is covered by covering sections 121 and 114, meaning that foreign matter cannot get in between each of board section 12 and board fixing member 21 and second housing section 14. Further, because covering sections 121 and 114 may be thin, the outer dimensions of imaging device 10 do not become larger, while as with the above embodiment, imaging device 10 can still be made smooth.

Imaging device 10 of the above embodiment includes board section 12 on which imaging element is loaded, first housing section 13 for fixing board section 12 from a surface on which imaging element 17 is loaded; second housing section 14 for fixing board section 12 from a surface opposite to the surface on which imaging element 17 is loaded; and lens section 15 attached to the first housing section 13 side; first housing section 13 and second housing section 14 are fixed by attachment members 25 so as to sandwich board section 12. By this, it is possible to make the outer dimensions of imaging device 10 about the same size as the outer dimensions of board section 12, and imaging device 10 can be made small.

Also, with imaging device 10 of the above embodiment, the outer walls of imaging device 10 are configured from first housing section 13 and second housing section 14. By this, it is not necessary to form outer walls of imaging device 10 separately, thus reducing the quantity of components and allowing for a small size.

Also, with imaging device 10 of the above embodiment, conductor body pattern 23 for heat dissipation connected to a ground potential of board section 12 is formed on at least one surface of board section 12, and board section 12 is connected to first and second housing sections 13 and 14 in a state with conductor body pattern 23 connected to connection section 21b (14b) formed on at least one of first housing section 13 and second housing section 14. By this, heat generated by imaging element 17 is dissipated via at least one of first housing section 13 and second housing section 14 that conductor body pattern 23 is connected to. Thus, the heat dissipation properties are improved by the basic configuration of imaging device 10 and it is not necessary to add a special member for heat dissipation.

With imaging device 10 of the above embodiment, first housing section 13 is configured from board fixing member 21 for fixing board section 12, and lens attachment member 22 for attaching lens section 15, and lens attachment member 22 is fixed to board fixing member 21 in a positionally adjustable manner. By this, by adjusting the position of lens attachment section 22 with respect to board fixing member 21, it is possible to adjust the pitch of the optical axis of lens section 15 with respect to imaging element 17, and to adjust the optical axis of lens section 15, and the rotational deviation of lens section 15 with respect to imaging element 17.

Also, with imaging device 10 of the above embodiment, board fixing member 21 of first housing section 13, and second housing section 14 are formed from a metal with high heat dissipation properties such as aluminum. By this, the heat dissipation effect of first housing section 13 (board fixing member 21) and second housing section 14 that conductor body pattern 23 is connected to is improved.

Figure 8:
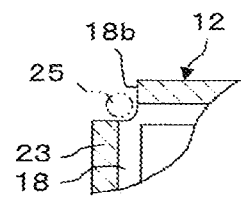
FIG. 8 is another alternative embodiment of the present disclosure.

In the above embodiment, first attachment member 25 that fixes board section 12 by sandwiching board section 12 between first housing section 13 (board fixing member 21) and second housing section 14 is given as an example that fixes by being inserted through through-holes 18a provided in control board 18 of board section 12; however, fixing may be performed without first attachment member 25 going through board section 12 (control board 18). For example, as shown in FIG. 8, cutout 18b may be formed in the four corners of board section 12, and first attachment member 25 may be inserted through a portion of this cutout 18b.

The disclosure is not limited to the configuration described in the embodiments described above, and various embodiments may be adopted within a scope that does not depart from the gist of the present disclosure described in the claims.

INDUSTRIAL APPLICABILITY

The imaging device of the present disclosure may be applied to an industrial-use camera configured such that a board section on which an imaging element is loaded is fixed by a first and second housing section.

REFERENCE SIGNS LIST

10: imaging device; 12: board section; 13: first housing section; 14: second housing section; 14b: contact section; 15: lens section; 17: imaging element; 18: control board; 21: board fixing member; 21b: contact section; 22: lens attachment member; 23: conductor body pattern; 25, 26: attachment member

The invention claimed is:

1. An imaging device comprising:
a board section on which an imaging element is loaded, the board section including a first through hole and a conductor body pattern formed on an edge surface of a top side of the board section;
a first housing section for fixing the board section from a surface on which the imaging element is loaded, the first housing section including a screw hole;
a second housing section for fixing the board section from a surface opposite to the surface on which the imaging element is loaded, the second housing section including a second through hole;
a lens section attached to the first housing section; and
an attachment member that extends through the second through hole, extends through the first through hole, and screws into the screw hole to fix the first housing section and the second housing section so as to sandwich the board section,
wherein the conductor body pattern is connected to a ground potential of the board section, and one of the first housing section and the second housing section contact the conductor body pattern when fixed to the board section,
wherein the conductor body pattern is a first conductor body pattern and the board section includes a second conductor body pattern on an edge surface of a bottom side of the board section that is opposite to the top side,
wherein the first conductor body pattern contacts the first housing section when fixed to the board section and the second conductor body pattern contacts the second housing section when fixed to the board section,
wherein the first conductor body pattern and the second conductor body pattern are each formed in the board section and covered by a protective layer at portions other than the edge surface of the top side and the bottom side of the board section, respectively,
wherein the board section includes a control board formed from a glass-epoxy board and the protective layer is formed by a resist on a top side and on a bottom side of the control board, and
wherein the first conductor body pattern and the second conductor body pattern are formed by copper wiring in the glass-epoxy board exposed by removal of the protective layer.

2. The imaging device according to claim 1, wherein the first housing section and the second housing section configure an outside wall of the imaging device.

3. The imaging device according to claim 1, wherein the first housing section includes a board fixing member for fixing the board section, and a lens attachment member for attaching the lens section, the lens attachment member being fixed to the board fixing member in a positionally adjustable manner.

4. The imaging device according to claim 3, wherein the board fixing member of the first housing section, and the second housing section, are formed from a metal with high heat dissipation properties such as aluminum.

5. The imaging device according to claim 3, wherein the first housing section includes a shim between seating surfaces of the board fixing member and the lens attachment member.

6. The imaging device according to claim 1, wherein the attachment member extends in a direction parallel to an optical axis of the lens section.

* * * * *